(12) United States Patent
Rahimo

(10) Patent No.: US 10,037,978 B2
(45) Date of Patent: Jul. 31, 2018

(54) SEMICONDUCTOR MODULE AND STACK ARRANGEMENT OF SEMICONDUCTOR MODULES

(71) Applicant: ABB Schweiz AG, Baden (CH)

(72) Inventor: Munaf Rahimo, Uezwil (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/495,174

(22) Filed: Apr. 24, 2017

(65) Prior Publication Data

US 2017/0229427 A1 Aug. 10, 2017

Related U.S. Application Data

(63) Continuation of application No. PCT/EP2015/068479, filed on Aug. 11, 2015.

(30) Foreign Application Priority Data

Oct. 24, 2014 (EP) ..................................... 14190279

(51) Int. Cl.
*H01L 25/07* (2006.01)
*H01L 29/739* (2006.01)

(52) U.S. Cl.
CPC ........ *H01L 25/071* (2013.01); *H01L 29/7393* (2013.01)

(58) Field of Classification Search
CPC ..................................................... H01L 25/071
See application file for complete search history.

(56) References Cited

U.S. PATENT DOCUMENTS 6,285,076 B1 * 9/2001 Ando ..................... H01L 24/72
257/690
6,642,576 B1 * 11/2003 Shirasawa et al. ... H01L 25/071
257/690

(Continued)

FOREIGN PATENT DOCUMENTS

EP 0443155 A1 8/1991
EP 0637080 A1 2/1995

OTHER PUBLICATIONS

European Patent Office, International Preliminary Report of Patentability issued in corresponding Application No. PCT/EP2015/068479, dated Sep. 27, 2016, 5 pp.

(Continued)

*Primary Examiner* — Raj R Gupta
(74) *Attorney, Agent, or Firm* — Taft Stettinius & Hollister LLP; J. Bruce Schelkopf

(57) ABSTRACT

A semiconductor module and a stack arrangement of semiconductor modules is proposed. The semiconductor module comprises an insulated gate bipolar transistor, a wide band-gap switch, a base plate, and a press device. The insulated gate bipolar transistor and the wide band-gap switch are connected in parallel and are each mounted with a first planar terminal to a side of the base plate. Further, a second planar terminal of the insulated gate bipolar transistor and a second planar terminal of the wind band-gap switch are connected with an electrically conductive connection element, and the press device is arranged on the second planar terminal of the insulated gate bipolar transistor. Hence, when arranging the semiconductor modules in a stack arrangement, any press force is primarily applied to the insulated gate bipolar transistors of the semiconductor modules.

20 Claims, 3 Drawing Sheets

(56) References Cited

U.S. PATENT DOCUMENTS

2004/0188706 A1    9/2004  Chang et al.
2011/0266665 A1*  11/2011  Gowda et al. .......... H01L 23/48
                                                        257/690
2014/0185346 A1    7/2014  Liu et al.

OTHER PUBLICATIONS

European Patent Office, International Search Report & Written Opinion issued in corresponding Application No. PCT/EP2015/068479, dated Nov. 4, 2015, 9 pp.
European Patent Office, Extended Search Report issued in corresponding Application No. 14190279.1, dated Mar. 25, 2015, 4 pp.

* cited by examiner

SEMICONDUCTOR MODULE AND STACK ARRANGEMENT OF SEMICONDUCTOR MODULES

FIELD OF THE INVENTION

The invention relates to the field of power semiconductor electronics. In particular the invention relates to a power semiconductor module and a stack arrangement of power semiconductor modules.

BACKGROUND OF THE INVENTION

Semiconductor switches based on wide band-gap (WBG) materials, in particular unipolar materials, such as e.g. Silicon Carbide (SiC) and Gallium Nitride (GaN), provide low switching losses due to inherent advantages of these materials, such as e.g. low leakage currents at high operational temperatures and low losses at low currents. Therefore, such semiconductor switches are also suitable for high-frequency applications.

However, for instance SiC based switches are currently restricted to smaller size chips compared to bipolar Silicon (Si) based switches. For example, typical dimensions of a base area of bipolar Si switches employed in semiconductor modules are in the order of 17×17 mm$^2$, whereas SiC switches are not exceeding half those values at best due to defect and yield issues with associated higher costs.

Moreover, the small-sized wide band-gap switches may have certain drawbacks compared to bipolar Si based switches, such as oscillatory behavior, high on-state losses at high temperatures and currents, and less fault current handling capability.

US 2014/0185346 A1 relates to a hybrid power device comprising first and second switching devices containing first and second unequal band-gap semiconductor materials. wherein the switching devices are three or more terminal switching devices of different type.

EP 0 443 155 B1 relates to a switchgear for switching on and off, having a driver for switching MOS-FET semiconductors, which are connected in parallel, and IGBT power semiconductors.

US 2004/0188706 A1 discloses a semiconductor module with an IGBT and with a wide band-gap diode, whereby the IGBT and with a wide band-gap diode are arranged on a base plate.

EP 0 637 080 A1 discloses a pressure con-tact type power module with press devices arranged on IGBT structures.

DESCRIPTION OF THE INVENTION

It is an object of the invention to provide a semiconductor module with a wide band-gap switch and a bipolar Si based switch, which may easily be series connected in a stack arrangement in order to increase a power and/or voltage.

This object is achieved by the subject-matter of the independent claim. Further exemplary embodiments are evident from the dependent claims and the following description.

An aspect of the invention relates to a semiconductor module. The semiconductor module may particularly be a high-power semiconductor module adapted for processing currents above approximately 10 A and/or voltages above approximately 100 V.

According to an embodiment of the invention, the semiconductor module comprises an insulated gate bipolar transistor, a wide band-gap switch (which may be a wide band-gap transistor), a base plate, and a press device. The insulated gate bipolar transistor comprises a first planar terminal and a second planar terminal and the wide band-gap switch comprises a first planar terminal and a second planar terminal. The insulated gate bipolar transistor and the wide band-gap switch are connected in parallel, whereby for the parallel connection the first planar terminal of the insulated gate bipolar transistor and the first planar terminal of the wide band-gap switch are mounted to the same side of the base plate. The first planar terminal of the insulated gate bipolar transistor and/or the planar first terminal of the wide band-gap switch may for instance be soldered and/or welded to the side of the base plate. The "side" of the base plate may denote here and in the following an outer surface and/or a surface area of the base plate. Furthermore, the second planar terminal of the insulated gate bipolar transistor and the second planar terminal of the wide band-gap switch are connected with an electrically conductive connection element, and the press device is arranged on the second planar terminal of the insulated gate bipolar transistor. The second planar terminals may be on a side of the respective transistor opposite to the first planar terminals. Moreover, the semiconductor module further comprises at least one gate pad for connecting a gate of the insulated gate bipolar transistor and a gate of the wide band-gap switch for the purpose to interconnect the gate of the insulated gate bipolar transistor and the gate of the wide band-gap switch, which gate pad is insulated mounted on the same side of the base plate as the first planar terminal of the insulated gate bipolar transistor and the first planar terminal of the wide band-gap switch. A gate of one of the transistors may be provided by a planar gate terminal, which may be provided on the side of the respective transistor also providing the second terminal.

As outlined above, due to their relatively small size wide band-gap switches employed exclusively in semiconductor modules, i.e. a so-called full wide band-gap module, may be unsuitable for a stack arrangement of such modules, i.e. a so-called press pack of such modules, targeting the ease of series connection of the modules and very high current ratings exceeding approximately 1000 A. The small wide band-gap switches may also not be suitable for failure fault conditions protection in press packs and/or stack arrangements, such as a short circuit failure mode (SCFM).

On one hand, by electrically connecting the insulated gate bipolar transistor and the wide band-gap switch in parallel, a hybrid semiconductor module may be provided, allowing to benefit from various advantageous properties of both the insulated gate bipolar transistor and the wide band-gap switch. The main advantages of the parallel arrangement are, apart from the lower cost, low conduction losses over the full current range, low switching losses, low thermal resistance, soft turn-off performance, high switching robustness, and improved fault current protection. This may result in optimum properties of the entire semiconductor module in terms of thermal, conduction (losses), switching (losses, softness), and fault conditions performance (surge, short circuit, short circuit failure mode "SCFM"), overall performance, and costs compared to a full wide band-gap module. On the other hand, by arranging the press device solely on the second terminal of the large-sized insulated gate bipolar transistor, thereby exerting a force on the insulated gate bipolar transistor in a direction antiparallel to a surface normal vector of the side of the base plate, the semiconductor module as proposed may advantageously be arranged in a stack arrangement of series connected modules.

In other words, to resolve the above-mentioned drawbacks for employing wide band-gap switches in press pack modules and/or stack arrangements, in combination with the advantages of a Si based switch and wide band-gap switch connected in parallel in the hybrid module, the invention proposes a concept that provides a press pack arrangement for employing the hybrid module in such a pack and in particular a stack arrangement.

Apart from the above-mentioned advantages, the inventive semiconductor module may further provide improved protection characteristics due to the large area insulated gate bipolar transistor. Amongst others, this includes high current and series connection high voltage capability especially for grid applications, such as e.g. High-Voltage-DC (HVDC) and flexible AC transmission systems (FACTS), short circuit failure mode through the press device and the insulated gate bipolar transistor, regardless if the insulated gate bipolar transistor or the wide band-gap switch fails, good short circuit capability due to the Si base insulated gate bipolar transistor by ensuring that the insulated gate bipolar transistor has a higher short circuit (saturation current) when compared to the wide band-gap gap switch, good avalanche capability by ensuring that the avalanche breakdown of the insulated gate bipolar transistor is lower than that of the wide band-gap switch, and good surge current capability of the insulated gate bipolar transistor, e.g. a reverse conducting insulated gate bipolar transistor in diode mode.

The gate pad may comprise for instance an electrically conductive strip, strap, bar, tape, stripe and/or plate. The gate pad may be arranged and/or attached to an insulated area of the base plate, for instance by arranging an insulation layer, an insulation film. and/or an insulating spacer between the base plate and the gate pad. The gate pad may be arranged on the side of the base plate and/or on various other parts of the base plate. However, the gate pad may also be arranged separately from the base plate in the semiconductor module. The gate pad is a common gate pad interconnecting the gate of the insulated gate bipolar transistor and the gate of the wide band-gap switch. This may allow to simultaneously control the insulated gate bipolar transistor and the wide band-gap switch with a single gate control signal applied to the gate pad, which in turn may simplify an overall control of the module and it may simplify the module itself in terms of its layout and/or construction, thereby potentially reducing production costs.

According to an embodiment of the invention, the first planar terminal of the insulated gate bipolar transistor is a collector (i.e. a collector terminal) and the first planar terminal of the wide band-gap switch is a drain (i.e. a drain terminal). Further, the second planar terminal of the insulated gate bipolar transistor is an emitter (i.e. an emitter terminal) and the second planar terminal of the wide band-gap switch is a source (i.e. a source terminal). Thus, in order to connect the insulated gate bipolar transistor and the wide band-gap switch in parallel, the collector of the insulated gate bipolar transistor and the drain of the wide band-gap are mounted to the side of the base plate, and the emitter of the insulated gate bipolar transistor and the source of the wide band-gap switch are connected by the connection element. However, it may also be conceivable to mount the emitter and the source to the side of the base plate and to connect the collector and the drain with the connection element.

According to an embodiment of the invention, the connection element is at least one of a wire bond and a ribbon bond. Such types of bonds may easily be attached to the respective terminals of the insulated gate bipolar transistor and/or of the wide band-gap switch after mounting them on the base plate. This may simplify an assembly and/or production process of the module as well as maintenance and it may reduce production costs of the module. Further, this may provide and/or increase a flexibility in a layout and/or set-up of components of the module, such as e.g. a circuitry of the module, due to an inherent flexibility in arranging and/attaching the wire bond and/or the ribbon bond.

According to an embodiment of the invention, the gate of the insulated gate bipolar transistor and/or the gate of the wide band-gap switch is connected to the gate pad with at least one of a wire bond and a ribbon bond. This may further simplify the assembly. the production process and/or the maintenance of the module and may further increase the flexibility in the layout and/or set-up of components of the module.

According to an embodiment of the invention the insulated gate bipolar transistor is a bi-mode insulated gate transistor, BIGT, or a reverse conducting insulated gate bipolar transistor, RC-IGBT. Such types of transistors may provide advantages in terms of an overall performance, a power rating, and/or a lifetime.

According to an embodiment of the invention, the wide band-gap switch is a voltage controlled unipolar switch and/or a MOSFET (metal-oxide-semiconductor field-effect transistor). The term "voltage controlled switch" may relate to a switch and/or semiconductor device, whose output characteristics are determined and/or controlled by an electrical field depending on the voltage applied to the gate. For example, a MOSFET, a junction-gate field-effect transistor (JFET), and/or a high electron mobility transistor (HEMT) may be utilized as wide band-gap switch.

According to an embodiment of the invention, the wide band-gap switch is based on silicon carbide or gallium nitride. For example, a SiC MOSFET and/or a GaN HEMT may be utilized as wide band-gap switch. Such switches may particularly provide low losses at low currents.

According to an embodiment of the invention, the press device comprises at least one spring element and/or at least one plate element. In general, the press device may be adapted to exert a certain force on the insulated gate bipolar transistor towards the base plate while not damaging the transistor. For this purpose the press device may comprise the spring element, which may at least partially be elastically deformable and/or compressible to a certain degree. The spring element may comprise e.g. a torsion spring, a compound spring, a flat spring, and/or another elastic element, such as e.g. a rubber or silicon element. Further, the press device may provide a certain stability against immoderate or excessive deformation, which may be provided by the plate element.

According to an embodiment of the invention, the semiconductor module comprises a plurality of insulated gate bipolar transistors and/or a plurality of wide band-gap switches arranged in juxtaposition on the side of the base plate. In this way, a power, a robustness and/or a compactness of module may be enhanced. The plurality of insulated gate bipolar transistors and wide band-gap switches may be arranged in several rows and/or an arbitrary pattern on the base plate. For instance, the wide band-gap switches may be arranged in a middle region of the side of the base plate, and the insulated gate bipolar transistors may be arranged in an edge or border region of the side of the base plate.

According to an embodiment of the invention, a number of the plurality of insulated gate bipolar transistors is connected to a single wide band-gap switch, and/or a number of the plurality of wide band-gap switches is connected to a single insulated gate bipolar transistor. This may simplify a layout and/or a control of the module and may reduce overall costs of the module.

According to an embodiment of the invention, a number of the plurality of wide band-gap switches is interconnected with at least one of a wire bond and a ribbon bond. This may further simplify a control of the module's wide band-gap switches.

According to an embodiment of the invention, the semiconductor module further comprises an electrically conducting plate arranged opposite of the base plate, fixating the press device on the insulated gate bipolar transistor. The plate may thus be arranged on an outer surface of the press device opposing a further surface of the press device, which may be in contact with and/or arranged on the second terminal of the insulated gate bipolar transistor, such that the press device is arranged between the plate and the second terminal of the insulated gate bipolar transistor. Such arrangement may facilitate to stack several inventive semiconductor modules on top of each other, allowing to easily interconnect neighboring modules in series. The electrically conducting plate and the base plate may be mechanically connected by an (electrically non-conducting) housing of the module.

According to an embodiment of the invention, the semiconductor module further comprises at least one diode. The diode may for instance be based on Si, SiC, Ge, and/or Gn. Further, the diode may be bonded to an element of the semiconductor module, such as e.g. the base plate, and it may be connected electrically to other elements of the semiconductor module, for instance via a wire bond and/or a ribbon bond. The diode may also be formed as an integrated internal diode of at least one of the wide band-gap switch and the integrated gate bipolar transistor. Moreover, the diode may be a PIN diode or a bipolar diode, and the diode my be forward or reverse conducting. In general, the diode may provide surge current or over-current carrying capability and/or it may provide further conduction capability for the semiconductor module.

Another aspect of the invention relates to a stack arrangement of semiconductor modules. The stack arrangement comprises at least a first semiconductor module and at least a second semiconductor module as described in the above and in the following. Therein, the second semiconductor module is arranged on the first semiconductor module, such that the base plate of the second semiconductor module presses onto the press device of the first semiconductor module, which in turn presses on the second planar terminal of the insulated gate bipolar transistor of the first semiconductor module. In this way, basically an arbitrary number of semiconductor modules may be stacked in compact manner and may be series connected in order to increase a power of the stack arrangement.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principal, identical parts are provided with the same reference symbols in the figures.

DETAILED DESCRIPTION OF EXEMPLARY EMBODIMENTS

Figure 1A:
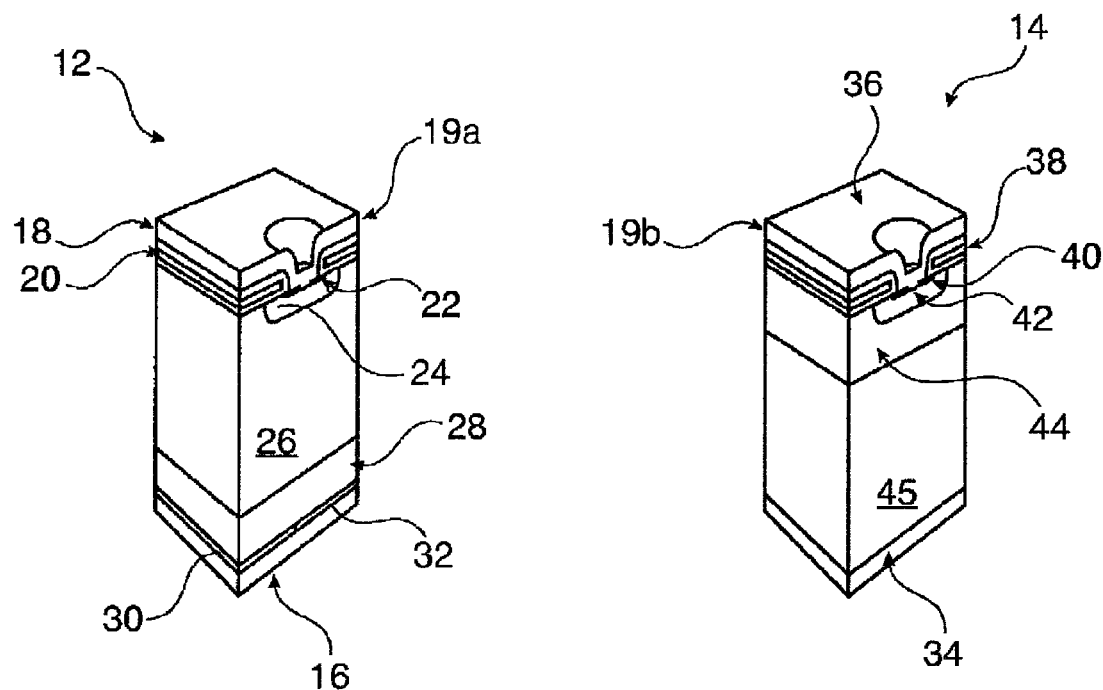
FIG. 1A shows a structural illustration of an insulated gate bipolar transistor and a wide band-gap switch for a semiconductor module according to an embodiment of the invention.
Figure 1B:
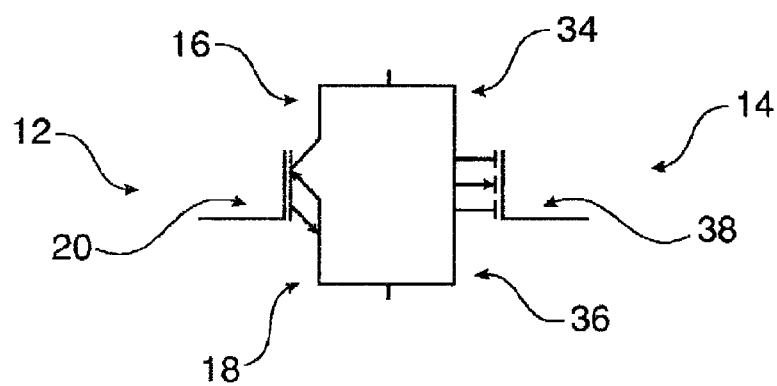
FIG. 1B shows a circuit diagram of a semiconductor module according to an embodiment of the invention.
Figure 2:
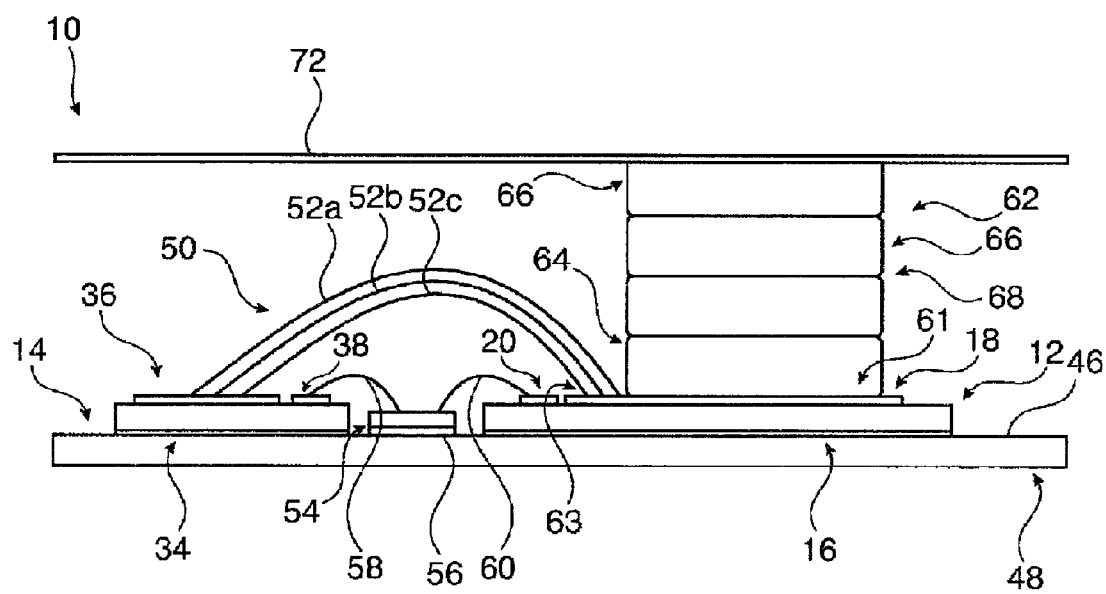
FIG. 2 shows a semiconductor module according to an embodiment of the invention.
Figure 3:
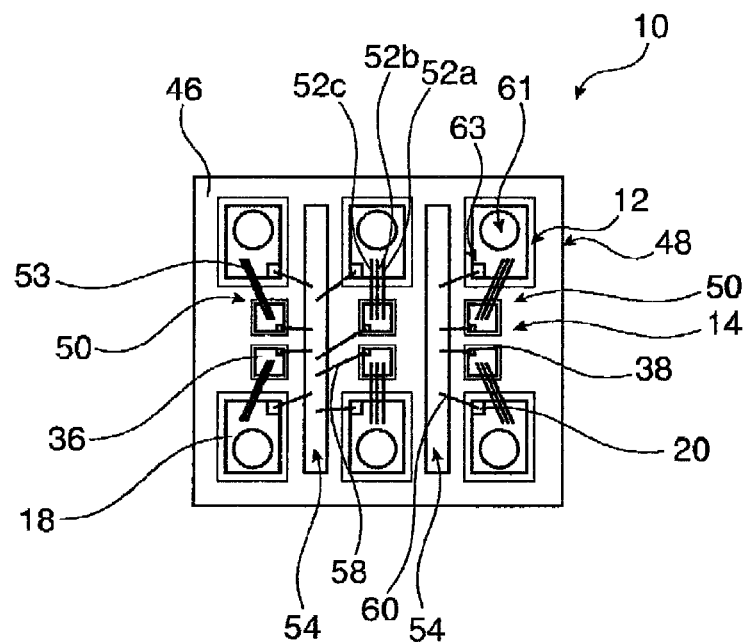
FIG. 3 shows a top-view of a semiconductor module according to an embodiment of the invention.

FIG. 1A shows an insulated gate bipolar transistor 12 in the form of a reverse-conducting insulated gate bipolar transistor (RC-IGBT) and a wide band-gap switch 14 in the form of a SiC MOSFET for a semiconductor module 10 (see FIGS. 2 and 3). FIG. 1B shows a circuit diagram for the module 10.

On a first end the RC-IGBT 12 comprises a first planar terminal 16, which is a collector, and on a second end opposing the first end the RC-IGBT 12 comprises a second planar terminal 18, which is an emitter. FIG. 1A only shows one metal-oxide semiconductor cell 19a (MOS cells). The RC-IGBT 12 is composed of a plurality of such cells 19a. Further, neighboring the second planar terminal 18, the RC-IGBT 12 comprises a gate 20 for controlling the RC-IGBT 12. Adjacent to the gate 20, the RC-IGBT 12 comprises an n$^-$-doped region 22 and a p-doped region 24, which are at least partially embedded in an n-base layer 26. The n-base layer 26 adjoins an n-buffer layer 28, which in turn adjoins a p-doped region 30 and an n-doped region 32 arranged between the n-buffer layer 28 and the first planar terminal 16, thereby providing a reverse conducting diode of the RC-IGBT 12.

The SiC MOSFET 14 comprises on a first end a first planar terminal 34, which is a drain, and a second planar terminal 36, which is a source, on a second end opposing the first end. FIG. 1A only shows one metal-oxide semiconductor cells 19b (MOS cells). The SiC MOSFET 14 is composed of a plurality of such cells 19b. The SiC MOSFET 14 further comprises a gate 38 neighboring the second planar terminal 36 for controlling the SiC MOSFET 14. Adjacent to the gate 38, the SiC MOSFET 14 comprises an n$^+$-doped region 40 and a p-doped region 42, which are at least partially embedded in an n-base layer 44. Between the n-base layer 44 and the first planar terminal 34, an n+-doped layer 45 is arranged.

As depicted in the circuitry diagram of FIG. 1B, the RC-IGBT 12 is connected in parallel to the SiC MOSFET 14, wherein the respective first planar terminals 16, 34 and the second planar terminals 18, 36 are interconnected. To be more precise, the collector of the RC-IGBT 12 is connected to the drain of the SiC MOSFET 14 and the emitter of the RC-IGBT 12 is connected to the source of the SiC MOSFET 14.

Figure 1C:
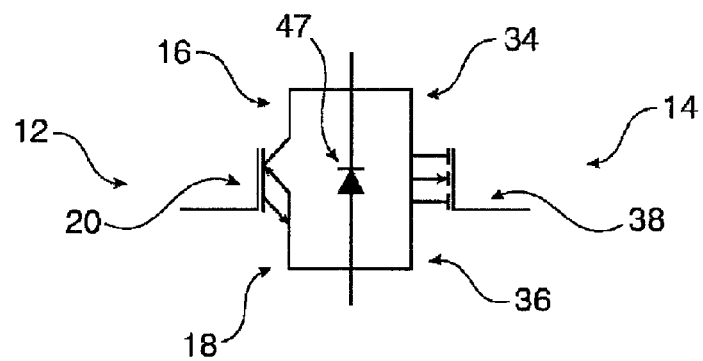
FIG. 1C shows a circuit diagram of a semiconductor module according to a further embodiment of the invention.

FIG. 1C shows a circuit diagram of a semiconductor module 10 according to a further embodiment of the invention. If not stated otherwise, the semiconductor module 10 of FIG. 1C may comprise the same elements and features as the semiconductor module 10 of FIG. 1B.

In addition to an insulated gate bipolar transistor 12 connected in parallel to a wide bad-gap switch 14, the semiconductor module 10 of FIG. 10 comprises a diode 47. The diode 47 may be reverse conducting and it may provide surge current or over-current carrying capability and/or it may provide a further conduction capability to the semiconductor module 10. For example, the diode 47 may provide a conduction path from an emitter terminal 18 of the insulated gate bipolar transistor 12 and the source terminal 36 of the wide band-gap switch 14 to the collector terminal 16 of the insulated gate bipolar transistor 12 and the drain terminal 34 of the wide band-gap switch 14. The diode 47 may be mounted e.g. to a base plate 48 (see FIG. 2) of the semiconductor module 10, and it may electrically be connected e.g. by a wire bond and/or a ribbon bond. However, there might also be a plurality of diodes arranged in the semiconductor module 10. Moreover, the diode 47 may also be an internal integrated diode of the insulated gate bipolar transistor 12 and/or the wide band-gap switch 14, such as e.g. an internal Positive-Intrinsic-Negative diode or an internal bipolar diode.

FIG. 2 shows a semiconductor module 10 according to an embodiment of the invention. The semiconductor module 10 comprises an insulated gate bipolar transistor (IGBT) 12, which may for instance be an RC-IGBT, a BIGT or a common IGBT, and a voltage controlled unipolar wide band-gap (WBG) switch 14, which may e.g. be a SiC MOSFET. A separate Si and/or WBG diode may also be included when required and depending on the application but preferably not by using an RC-IGBT or BIGT and/or utilizing the internal SiC MOSFET.

Both the IGBT 12 and the WBG switch 14 are mounted to a side 46 of a base plate 48. The side 46 may in this context denote an outer planar surface of the base plate 48. In more detail, both the IGBT 12 and the WBG switch 14 are mounted with their respective first planar terminal 16, 34 to the side 46 of the base plate 48. For instance the first planar terminals 16, 34 may be welded and/or soldered to the side 46, such that they are electrically connected via the base plate 48. For this purpose the base plate may be manufactured from an electrically conductive material, such as metal and/or an appropriate alloy. The first planar terminal 16 of the IGBT 12 shown in FIG. 2 is a collector or collector terminal of the IGBT 12 and the first planar terminal 34 of the WBG switch 14 is a drain or drain terminal.

On an end of the IGBT 12 opposing the base plate 48, the IGBT comprises a second planar terminal 18, which is an emitter or an emitter terminal. The second planar terminal 18 of the IGBT 12 is electrically connected with an electrically conductive connection element to a second planar terminal 36 of the WBG switch 14, which is a source or source terminal of the WBG switch 14. By connecting the collector of the IGBT 12 with the drain of the WBG switch 14 via the base plate 48 and by connecting the source of the WBG switch 14 with the emitter of the IGBT 12, the IGBT 12 and the WBG switch 14 are electrically connected in parallel. The connection element 50 shown in FIG. 2 comprises a plurality of wire bonds 52a, 52b, 52c connecting the source of the WBG switch 14 and the emitter of the IGBT 12. Alternatively or additionally, the connection element 50 may comprise a ribbon bond for connecting the second planar terminals 18, 36 of the WBG switch 14 and the IGBT 12, respectively.

However, in order to employ a parallel connection of these elements, it is also possible to mount the emitter of the IGBT 12 and the source of the WBG switch 14 to the side 46 of the base plate 48 and connect the drain of the WBG switch 14 and the collector of the IGBT 12 with the connection element 50.

The first planar terminals 16, 34 and the second planar terminals 18, 36 of the IGBT 12 and the WBG switch 14, respectively, may also each comprise a pad of electrically conductive material in order to provide an optimum electrical connection, i.e. there might an emitter pad, a collector pad, a source pad, and/or a drain pad provided at the respective first planar terminals 16, 34 and/or the second planar terminals 18, 36 of the IGBT 12 and/or the WBG switch 14.

The semiconductor module 10 further comprises a gate pad 54, which is insulated mounted to the side 46 of the base plate 48 in juxtaposition and/or between the IGBT 12 and the WBG switch 14. Between the gate pad 54 and the base plate 48 an insulation layer 56 is arranged, which is adapted to insulate the gate pad 54 and the base plate 48. The insulation layer 56 may for instance comprise a film of insulating material and/or an insulating spacer. The insulation layer 56 may for instance be glued, welded, and/or soldered to the base plate 48 and the gate pad 54 may for instance be glued, welded, and/or soldered to the insulation layer 56. The gate pad 54 is electrically connected to a gate 38 of the WBG switch 14 with a first gate connection element 58. The gate pad 54 is further connected to a gate 20 of the IGBT 12 with a second gate connection element 60. Thus, the gate pad 54 interconnects the gate 38 of the WBG switch 14 and the gate 20 of the IGBT 12. In this context, the gate pad 54 is designed as a common gate pad allowing to simultaneously control both the WBG switch 14 and the IGBT 12 via the respective gates 20, 38. However, it is also possible to utilize separate gate pads for the gates 20, 38 of the IGBT 12 and the WBG switch 14, respectively. The gate connection elements 58, 60 may be at least one of a wire bond and a ribbon bond.

The semiconductor module 10 further comprises a press device 62 which is arranged with a first end 64 on the second planar terminal 18 of the IGBT 12, i.e. the emitter of the IGBT 12. The press device 62 may comprise at least one elastically deformable spring element 68 and/or at least one plate element 70 for mechanical stabilization. The press device 62 may be arbitrarily shaped, i.e. it may have e.g. a cylindrical shape, a cubic shape or a rectangular shape. Further, the press device 62 may have an arbitrary cross-section, such as e.g. a round, a polygon-like, a triangular or a rectangular cross-section. As shown in FIG. 2, the press-device 62 only covers a part of the second planar terminal 18 of the IGBT 12 since the second planar terminal 18 also needs to be connected via the connection element 50 to the second planar terminal 36 of the WBG switch 14. In other words, the IGBT 12, more precisely the second planar terminal 18 of the IGBT 12, comprises two regions, a first region 61 dedicated for the press device 62 and a second region 63 for electrically connecting the second planar terminal 18 of the IGBT 12 with the second planar terminal 36 of the WBG switch 14. The first and second region 61, 63 may be equally sized or the first region 61 may be larger in size than the second region 63.

Due to the fact, that the press device 62 is arranged solely on the second planar terminal 18 of the IGBT 12, any force or press force exerted by the press device 62 and/or transferred by the press device 64 primarily acts on the large-sized IGBT 12. Therein, the force exerted and/or transferred by the press device 62 has a direction antiparallel to a surface normal vector of the side 46 of the based plate 48, i.e. the force is directed towards the side 46 of the base plate 48. This way, basically an arbitrary number of semiconductor modules 10 may be stacked on top of each other and may be series connected in order to increase a power. Apart from that, the press device 62 may further provide a short circuit capability.

The semiconductor module 10 further comprises an electrically conducting plate 72, which is arranged on a second end 66 of the press device 62 opposing the first end 64. The plate 72 is thus arranged opposite of and parallel to the base plate 48. Accordingly, the press device 62 and the IGBT 12 are arranged between the plate 72 and the base plate 48. The plate 72 may be manufactured from an electrically conductive material, such as metal and/or an alloy. In general, the plate 72 is adapted for fixating the press device 62 on the IGBT 12 in a longitudinal direction of the press device 62. Apart from that, the plate 72 may allow and/or support and/or simplify stacking various semiconductor modules 10 on top of each other and connecting neighboring modules in series.

FIG. 3 shows a top-view of a semiconductor module 10 according to an embodiment of the invention. If not stated otherwise, the semiconductor module 10 of FIG. 3 may comprise the same features and elements as the semiconductor module of 10 FIG. 2.

The semiconductor module 10 comprises a plurality of six IGBTs 12 and six WBG switches 14. The IGBTs 12 are arranged in two rows of three IGBTs each in an edge or border region of the base plate 48, and the WBG switches 14 are arranged in two rows of three WBG switches 14 in a middle region of the base plate 48. The second planar terminals 18 of each IGBT 12 is electrically connected to a second planar terminal 38 of a WBG switch 14 with a connection element 50, which may be at least one of a wire bond 52a, 52b, 52c and a ribbon bond 53.

However, it is also possible to connect an arbitrary number or all of the plurality of IGBTs 12 to a single WBG switch 14 and/or to connect an arbitrary number or all of the plurality of WBG switches 14 to a single IGBT 12. Further, a number or all of the WBG switches 14 may be interconnected with at least one of a wire bond and a ribbon bond.

The semiconductor module 10 further comprises two gate pads 54 arranged between the IGBTs 12 and the WBG switches 14. Accordingly, one gate pad 54 interconnects the gates 20, 38 of two IGBTs 12 and two WBG switches 14, respectively, and one gate pad 54 interconnects the gates 20, 38 of four IGBTs 12 and four WBG switches 14. It is also possible to arrange only one gate pad 54 on the base plate 48 interconnecting all IGBTs 12 and WBG switches 14 of the semiconductor module or to arrange more than two gate pads 54.

Figure 4:
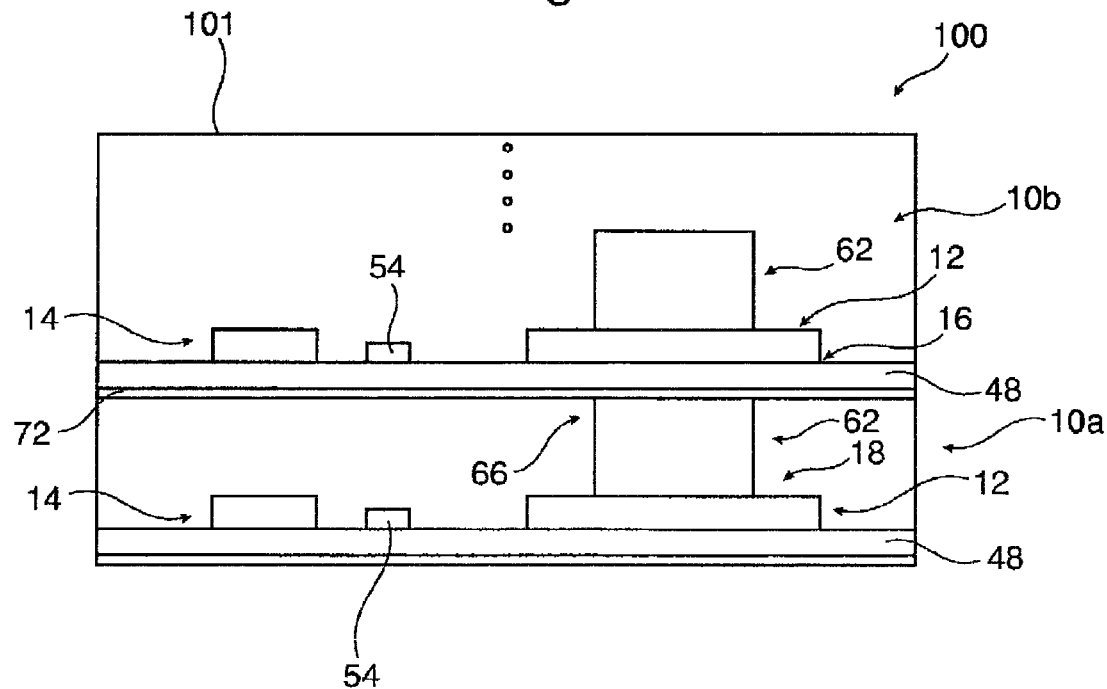
FIG. 4 shows a stack arrangement of semiconductor modules according to an embodiment of the invention.

FIG. 4 shows a stack arrangement 100 of semiconductor modules 10a, 10b according to an embodiment of the invention. The stack arrangement 100 comprises a housing 101, in which the semiconductor modules 10a, 10b are arranged and/or stacked on top of each other and in which the modules 10a, 10b are optionally mechanically fixed by fixating means.

In the stack arrangement 100 of FIG. 4 a first semiconductor module 10a and a second semiconductor module 10b are shown, but the stack arrangement 100 may basically comprise an arbitrary number of semiconductor modules 10, 10a, 10b as indicated by the dots in FIG. 4.

As can be seen, the first semiconductor module 10a is arranged in the housing 101 of the stack arrangement 100 such that a further side of the base plate 48 opposing the side 46 faces an inner surface of the housing 101. The second semiconductor module 10b is arranged on the first semiconductor module 10a, such that the base plate 48 of the second semiconductor module 10b presses onto the press device 62 of the first semiconductor module 10a, which in turn presses on the second planar terminal 18 of the first semiconductor module 10a. For this purpose, the base plate 48 of the second semiconductor module 10b may be arranged directly on the second end 66 of the press device 62 of the first semiconductor module 10a. Alternatively, it may be arranged on the plate 72 of the first semiconductor module 10a. In this way, the first and the second semiconductor modules 10a, 10b are electrically connected in series in form of a press pack, wherein the first planar terminal 16 of the IGBT 12 of the second semiconductor module 10b is connected via the base plate 48 of the second semiconductor module 10b and/or the plate 72 with the press device 62 and the second planar terminal 18 of the IGBT 12 of the first semiconductor module 10a.

While the invention has been illustrated and described in detail in the drawings and the foregoing description, such illustration and description are to be considered illustrative or exemplary and not restrictive; the invention is not limited to the disclosed embodiments. Other variations to the disclosed embodiments can be understood and effected by those skilled in the art and practicing the claimed invention, from a study of the drawings, the disclosure, and the appended claims. In the claims, the word "comprising" does not exclude other elements or features, and the indefinite article "a" or "an" does not exclude a plurality. The mere fact that certain measures are recited in mutually different dependent claims does not indicate that a combination of these measures cannot be used to advantage. Any reference signs in the claims are not to be construed to as limiting the scope.

LIST OF REFERENCE SYMBOLS 10 semiconductor module
12 insulated gate bipolar transistor
14 wide band-gap switch
16 first terminal of IGBT
18 second terminal of IGBT
19a MOS cells of IGBT
19b MOS cells of WBG switch
20 gate of IGBT
22 n+-doped region
24 p-doped region
26 n-base layer
28 n-buffer layer
30 p-doped region
32 n-doped region
34 first terminal WBG switch
36 second terminal WBG switch
38 gate of WBG switch
40 n+-doped region
42 p-doped region
44 n-base layer
45 $n^+$-doped layer
46 side of base plate
47 diode
48 base plate
50 connection element
52a,b,c wire bond
53 ribbon bond
54 gate pad
56 insulation layer
58, 60 gate connection element
61 first region
62 press device 63 second region
64 first end of press device
66 second end of press device
68 spring element
70 plate element
72 plate
100 stack arrangement
101 housing

The invention claimed is:

1. A semiconductor module, comprising:
an insulated gate bipolar transistor;
a wide band-gap switch;
a base plate; and
a press device,
wherein the insulated gate bipolar transistor comprises a first planar terminal and a second planar terminal,
wherein the wide band-gap switch comprises a first planar terminal and a second planar terminal,
wherein the insulated gate bipolar transistor and the wide band-gap switch are connected in parallel, whereby for the parallel connection the first planar terminal of the insulated gate bipolar transistor and the first planar terminal of the wide band-gap switch are mounted to the same side of the base plate and the second planar terminal of the insulated gate bipolar transistor and the second planar terminal of the wide band-gap switch are connected with an electrically conductive connection element,
wherein the press device is arranged on the second planar terminal of the insulated gate bipolar transistor, and
wherein the semiconductor module further comprising at least one gate pad for connecting a gate of the insulated gate bipolar transistor and a gate of the wide band-gap switch in order to interconnect the gate of the insulated gate bipolar transistor and the gate of the wide band-gap switch, which gate pad is insulated mounted on the same side of the base plate as the first planar terminal of the insulated gate bipolar transistor and the first planar terminal of the wide band-gap switch.

2. The semiconductor module according to claim 1, wherein the first planar terminal of the insulated gate bipolar transistor is a collector and the first planar terminal of the wide band-gap switch is a drain, and/or wherein the second planar terminal of the insulated gate bipolar transistor is an emitter and the second planar terminal of the wide band-gap switch is a source.

3. The semiconductor module according to claim 2, wherein the connection element is at least one of a wire bond and a ribbon bond.

4. The semiconductor module according to claim 3, wherein the gate of the insulated gate bipolar transistor and/or the gate of the wide band-gap switch is connected to the gate pad with at least one of a wire bond and a ribbon bond.

5. The semiconductor module according to claim 2, wherein the gate of the insulated gate bipolar transistor and/or the gate of the wide band-gap switch is connected to the gate pad with at least one of a wire bond and a ribbon bond.

6. The semiconductor module according to claim 2, wherein the wide band-gap switch is a voltage controlled unipolar switch; and/or wherein the wide band-gap switch is a MOSFET.

7. The semiconductor module according to claim 1, wherein the connection element is at least one of a wire bond and a ribbon bond.

8. The semiconductor module according to claim 7, wherein the gate of the insulated gate bipolar transistor and/or the gate of the wide band-gap switch is connected to the gate pad with at least one of a wire bond and a ribbon bond.

9. The semiconductor module according to claim 1, wherein the gate of the insulated gate bipolar transistor and/or the gate of the wide band-gap switch is connected to the gate pad with at least one of a wire bond and a ribbon bond.

10. The semiconductor module according to claim 1, wherein the insulated gate bipolar transistor is a BIGT or an RC-IGBT.

11. The semiconductor module according to claim 1, wherein the wide band-gap switch is a voltage controlled unipolar switch; and/or wherein the wide band-gap switch is a MOSFET.

12. The semiconductor module according to claim 1, wherein the wide band-gap switch is based on silicon carbide or gallium nitride.

13. The semiconductor module according to claim 1, wherein the press device comprises at least one spring element and/or at least one plate element.

14. The semiconductor module according to claim 1, wherein the semiconductor module comprises a plurality of insulated gate bipolar transistors and/or a plurality of wide band-gap switches arranged in juxtaposition on the side of the base plate.

15. The semiconductor module according to claim 14, wherein a number of the plurality of insulated gate bipolar transistors is connected to a single wide band-gap switch, and/or
wherein a number of the plurality of wide band-gap switches is connected to a single insulated gate bipolar transistor.

16. The semiconductor module according to claim 15, wherein a number of the plurality of wide band-gap switches is interconnected with at least one of a wire bond and a ribbon bond.

17. The semiconductor module according to claim 14, wherein a number of the plurality of wide band-gap switches is interconnected with at least one of a wire bond and a ribbon bond.

18. The semiconductor module according to claim 1, further comprising:
an electrically conducting plate arranged opposite of the base plate, fixating the press device on the insulated gate bipolar transistor.

19. The semiconductor module according to claim 1, further comprising at least one diode.

20. A stack arrangement of semiconductor modules, comprising:
at least a first semiconductor module and at least a second semiconductor module, each of the first semiconductor module and the second semiconductor module comprise:
an insulated pate bipolar transistor;
a wide band-gap switch;
a base plate; and
a press device,
wherein the insulated gate bipolar transistor comprises a first planar terminal and a second planar terminal,
wherein the wide band-gap switch comprises a first planar terminal and a second planar terminal,
wherein the insulated gate bipolar transistor and the wide band-gap switch are connected in parallel, whereby for the parallel connection the first planar terminal of the insulated gate bipolar transistor and the first planar terminal of the wide band-gap switch are mounted to the same side of the base plate and the second planar terminal of the insulated gate bipolar transistor and the second planar terminal of the wide band-gap switch are connected with an electrically conductive connection element, wherein the press device is arranged on the second planar terminal of the insulated gate bipolar transistor, wherein the semiconductor module further comprising at least one gate pad for connecting a gate of the insulated gate bipolar transistor and a gate of the wide band-gap switch in order to interconnect the gate of the insulated gate bipolar transistor and the gate of the wide band-gap switch, which gate pad is insulated mounted on the same side of the base plate as the first planar terminal of the insulated gate bipolar transistor and the first planar terminal of the wide band-gap switch, and wherein the second semiconductor module is arranged on the first semiconductor module, such that the base plate of the second semiconductor module presses onto the press device of the first semiconductor module, which in turn presses on the second planar terminal of the insulated gate bipolar transistor of the first semiconductor module.

* * * * *